(12) United States Patent
Perillat et al.

(10) Patent No.: US 12,501,566 B2
(45) Date of Patent: Dec. 16, 2025

(54) PRINTED CIRCUIT HOUSING CONFIGURED TO ALLOW THE ELECTRICAL WIRES TO EMERGE

(71) Applicant: VITESCO TECHNOLOGIES GMBH, Regensburg (DE)

(72) Inventors: Bertrand Perillat, Toulouse (FR); Pascal Perrot, Toulouse (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 195 days.

(21) Appl. No.: 18/569,272

(22) PCT Filed: Jul. 12, 2022

(86) PCT No.: PCT/EP2022/069493
§ 371 (c)(1),
(2) Date: Dec. 12, 2023

(87) PCT Pub. No.: WO2023/285474
PCT Pub. Date: Jan. 19, 2023

(65) Prior Publication Data
US 2024/0292556 A1   Aug. 29, 2024

(30) Foreign Application Priority Data

Jul. 13, 2021 (FR) ...................................... 2107592
Sep. 30, 2021 (FR) ...................................... 2110345

(51) Int. Cl.
*H05K 5/02* (2006.01)
(52) U.S. Cl.
CPC .................. *H05K 5/0247* (2013.01)
(58) Field of Classification Search
CPC .................................................. H05K 5/0247
See application file for complete search history.

(56) References Cited

U.S. PATENT DOCUMENTS

| 4,851,611 A | 7/1989 | De Concini et al. |
| 6,244,880 B1 | 6/2001 | Fukase et al. |
| (Continued) | | |

FOREIGN PATENT DOCUMENTS

| CN | 203721872 U | 7/2014 |
| CN | 209838007 U | 12/2019 |
| (Continued) | | |

OTHER PUBLICATIONS

International Search Report for PCT/EP2022/069493 mailed Oct. 27, 2022, 4 pages.

(Continued)

*Primary Examiner* — Sherman Ng
(74) *Attorney, Agent, or Firm* — NIXON & VANDERHYE

(57) ABSTRACT

A protective housing fitted on board an automotive vehicle includes: a main housing space with a main cavity to receive a printed circuit, an upper opening for the insertion of the printed circuit into the main cavity, and at least one lateral groove, which includes two lateral slots each extending from an upper edge of the main housing space, and together forming a passage between the inside and outside of the main housing space; for each lateral groove, a respective retaining element, insertable into the lateral groove to locally close the passage between the inside and outside of the main housing space, so that in use, it comes to bear against a bundle of electrical wires emerging from the main cavity via the two lateral slots; and at each lateral groove, the two lateral slots each have a width substantially equal to the diameter of the electrical wires.

20 Claims, 7 Drawing Sheets

(56) References Cited

U.S. PATENT DOCUMENTS

| | | | |
|---|---|---|---|
| 6,422,882 B1 | 7/2002 | May et al. | |
| 8,529,283 B1 | 9/2013 | Carden | |
| 10,461,442 B2 * | 10/2019 | Takasaki | H01R 33/09 |
| 2006/0160405 A1 * | 7/2006 | Fabian | H01R 4/2433 |
| | | | 439/417 |
| 2015/0031248 A1 * | 1/2015 | Nishio | H01R 13/05 |
| | | | 439/691 |

FOREIGN PATENT DOCUMENTS

| | | |
|---|---|---|
| DE | 29702246 U1 | 3/1997 |
| FR | 2357091 A1 | 1/1978 |

OTHER PUBLICATIONS

Written Opinion of the ISA for PCT/EP2022/069493 mailed Oct. 27, 2022, 7 pages.

* cited by examiner

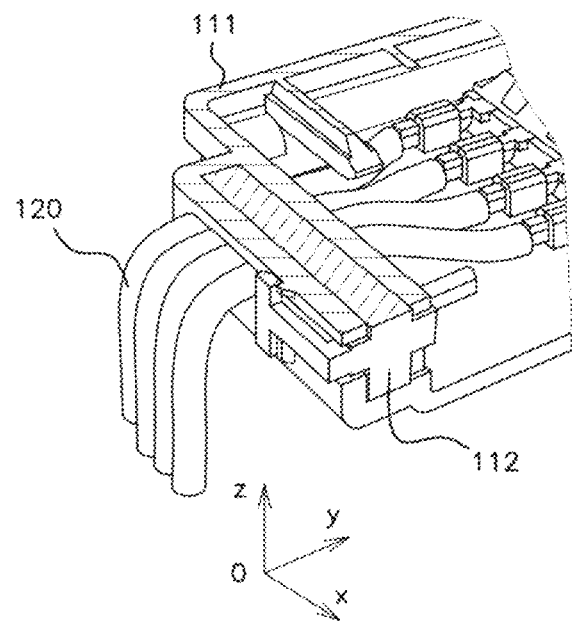
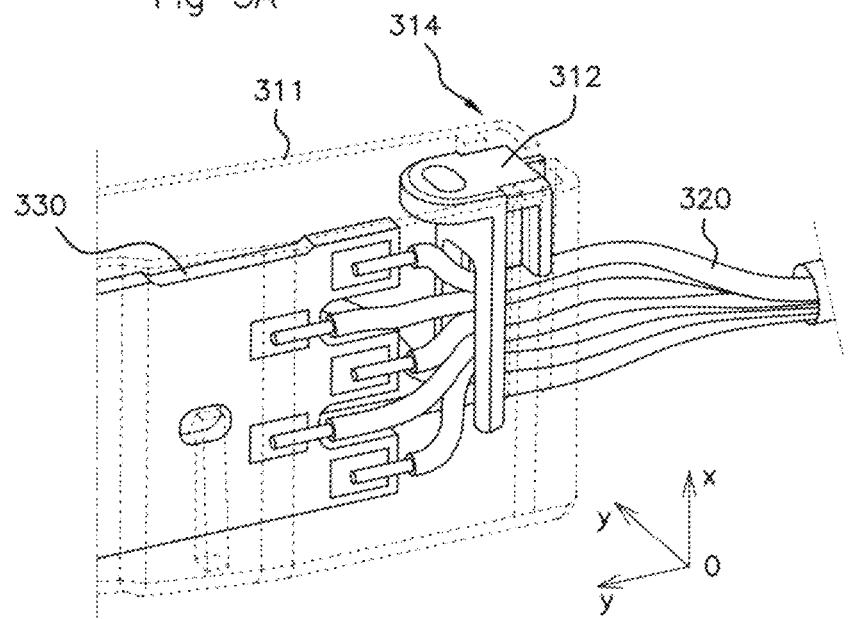

PRINTED CIRCUIT HOUSING CONFIGURED TO ALLOW THE ELECTRICAL WIRES TO EMERGE

This application is the U.S. national phase of International Application No. PCT/EP2022/069493 filed Jul. 12, 2022, which designated the U.S. and claims priority to FR Patent Application No. 2110345 filed Sep. 30, 2021, and FR Patent Application No. 2107592 filed Jul. 13, 2021, the entire contents of each of which are hereby incorporated by reference.

TECHNICAL FIELD

The invention concerns the automotive field and more particularly relates to a system for holding electrical wires in a housing intended to accommodate a printed circuit connected to a series of electrical wires.

As a preference, but nonlimitingly, the printed circuit is configured to detect presence and/or authenticate a user in order to control access to an automotive vehicle and/or to illuminate a region external to the vehicle and/or illuminate the ground.

The housing with the printed circuit and the electrical wires are intended to be housed in said automotive vehicle, preferably inside an external element of said vehicle. For example, the housing with the printed circuit and the electrical wires may be intended to be housed inside an exterior door-handle of the vehicle or inside a door lateral upright, or inside a bumper, or inside a tailgate or trunk lid, or inside a fuel filler flap or, respectively, an electric charging point flap, etc.

PRIOR ART

Sensors intended to detect presence and/or to authenticate a user in order to control access to an automotive vehicle are known from the prior art.

These sensors comprise a printed circuit connected to a series of electrical wires. The connections to the electrical wires are made at a series of contact points distributed over an external surface of the printed circuit. As a preference, these contact points are distributed along the edge of the printed circuit, along a single edge or two opposite edges of said printed circuit.

During the sensor-manufacturing process, the printed circuit connected to the electrical wires is slipped into a housing, via an upper opening in said housing. Following insertion into the housing, the electrical wires emerge from one side, or from two opposite sides, of the housing. Next, the housing is filled with a potting resin which fills all the remaining gaps inside the housing.

FIG. 1A illustrates such a sensor 10 in an intermediate stage in its manufacture, after the electrical wires 12 have been soldered to the printed circuit 13 and just before the printed circuit 13 is inserted into the housing 11. It may be seen that, prior to insertion, the electrical wires 12 are mutually spaced, mutually parallel, and parallel to the plane of the printed circuit 13. Here they are distributed in two series of wires, the series being situated one on each side of the printed circuit 13.

Insertion into the housing 11 is performed through a translational movement along the axis (Ox), where the axis (Ox) is parallel to the plane of the printed circuit 13, and orthogonal to the electrical wires 12. Insertion into the housing 11 is performed via an upper opening 15 in said housing.

FIG. 1B illustrates the sensor 10 after the printed circuit 13 has been inserted into the housing 11, and viewed in section in a plane parallel to the plane of the printed circuit.

It may be seen from FIG. 1B that, once the printed circuit 13 has been inserted into the housing 11, the electrical wires 12 emerge from the housing via two upper passages 14 situated one on each side of the housing 11 near the upper opening 15. In each of the upper passages, the adjacent electrical wires 12 are in direct physical contact with one another, forming a stack of wires along the axis (Ox). These wires thus completely fill said upper passage 14 to prevent any leakage of resin as this resin is poured into the housing.

One disadvantage with this solution, visible in FIG. 1B, is that the electrical wires 12 are bent, generating mechanical tension in the connection to the printed circuit 13. Such mechanical tension tends to cause the printed circuit 13 to pop out of the housing 11. There is also a risk of electrical disconnections between the printed circuit and the electrical wires.

In practice, the electrical wires 12 are kept bent by passing them under a hook belonging to the housing 11. This bending in order to pass the electrical wires 12 under the hook is an operation that can be performed only by hand, to the detriment of the production rates.

Other solutions overmold plastic around the electrical wires, this being performed prior to insertion in a housing equipped with suitable lateral slots. However, such solutions come at a higher cost, because of the overmolding. Furthermore, the overmolding needs to be suited to the number of wires, thereby reducing the mass-production possibilities.

The invention aims to overcome the disadvantages of the prior art.

DISCLOSURE OF THE INVENTION

This objective is achieved using a housing configured to receive a printed circuit and configured to allow electrical wires connected to said printed circuit to emerge from the housing.

In the invention, said housing comprises a main housing space to receive said printed circuit, and at least one retaining element to contribute to holding the electrical wires in position when the printed circuit is housed in the main housing space.

In particular, the invention covers a protective housing intended to be fitted on board an automotive vehicle, comprising a main housing space which is equipped with a main cavity to receive a printed circuit and which comprises an upper opening for inserting the printed circuit into the main cavity.

According to the invention:
the main housing space comprises at least one lateral groove, which extends along a lateral edge of the main housing space and which comprises two lateral slots each extending from an upper edge of the main housing space, at the same end as the upper opening, and together forming a passage between the inside and the outside of the main housing space; and
for each lateral groove, the protective housing comprises a respective retaining element, intended to be inserted at least partially into the corresponding lateral groove, each retaining element being configured to locally close the passage between the inside and the outside of the main housing space and, in use, to come to bear against a bundle of electrical wires emerging from the main cavity via the two lateral slots.

What is meant by "inside the main housing space" is, in particular, in the main cavity.

According to the invention, the retaining element forms an isolated element, physically distinct from other elements such as, for example, the bundle of electrical wires which are connected to the printed circuit.

The main housing space is configured to receive a printed circuit connected to a series of electrical wires. In use, the plane of the printed circuit extends between said closed end of the main cavity and said opening of the main housing space.

The main housing space has two lateral edges situated one on each side of the upper opening. These lateral edges each run parallel to an axis connecting the upper opening to a closed end of the main cavity. According to the invention, the main housing space comprises at least one lateral groove which extends along a lateral edge of the main housing space. Said lateral groove therefore has an elongate shape and extends along this axis connecting the upper opening and a closed end of the main cavity.

According to the invention, each lateral groove comprises two lateral slots situated facing one another, with one lateral slot being situated inside the main housing space and the other lateral slot being situated on an external wall of the main housing space. Each lateral slot has a shape that is elongate along an axis connecting the closed end of the main housing space and an upper edge of the main housing space.

According to the invention, a width of the lateral slots is substantially equal to the diameter of the electrical wires which, in use, are connected to the printed circuit. In particular, a width of the lateral slot which runs between the inside and the outside of the main housing space, is substantially equal to the diameter of the electrical wires which, in use, are connected to the printed circuit. What is meant by "substantially equal" is preferably that the difference between the diameter of an electrical wire and the width of the slots is less than or equal to 500 µm or even less than or equal to 100 µm. Thus, the passage between the inside and the outside of the main housing space is locally blocked by the electrical wires emerging from the main housing space stacked on one another. The width of the lateral slots is measured in a plane orthogonal to the plane of the largest dimensions of the main cavity, or in other words orthogonal to the plane of the printed circuit when this circuit is housed in the main housing space.

In use, each lateral groove receives a respective retaining element. In use, a printed circuit connected to electrical wires is housed in the main housing space, with the electrical wires emerging from the main housing space by passing through the lateral slots of the at least one lateral groove. In each lateral groove, the retaining element collaborates with the electrical wires to close the lateral slots, notably the lateral slot running between the inside and the outside of the main housing space. This then prevents any potting resin, added to the main housing space at a later time, from running out via the lateral slots.

In manufacture, the printed circuit with the electrical wires is inserted into the main housing space, passing the electrical wires through the at least one lateral groove and through the lateral slots. The electrical wires therefore emerge from the main housing space at the lateral edges thereof rather than at the upper edge thereof. Furthermore, the electrical wires are held in position by the pressure exerted by the retaining element rather than by being bent in order to pass under a hook. This then limits the torsion applied to the electrical wires, which torsion is liable to cause electrical disconnections between the printed circuit and the electrical wires. Furthermore, a complex movement of bending in order to pass under a hook is replaced by a simple translational movement of the retaining element, thereby improving manufacturing output.

According to the invention, the electrical wires emerging from the housing are held in position stacked on top of one another and pressed against a closed end of the lateral slots by the at least one retaining element. The retaining element according to the invention is thus driven at least partly into a lateral groove in order to press the electrical wires against the closed end of the slots, so that said wires form a compact (or tightly-packed) stack. The retaining element is suited to being driven at least partially into the lateral groove to a depth that is such that the electrical wires are kept pressed against a closed end of the lateral slots. The retaining element will be driven into the lateral groove to a greater or lesser depth depending on the number of electrical wires emerging via said lateral slots. The invention therefore offers a great deal of flexibility because the same size of retaining element can be used for achieving the desired retention of the electrical wires, whatever the number and diameter of said electrical wires. Adaptation is in fact obtained not by means of the dimensions of the retaining element, but by means of the depth to which it is driven into the lateral groove. Stated another way, it is possible to use the one same housing (made up of a main housing space and at least one retaining element) whatever the number of electrical wires that are to emerge therefrom.

As a preference, in each lateral groove, the lateral slot running between the inside and the outside of the main housing space extends to a depth greater than or equal to half the depth of the main cavity, said depths being measured from a plane accommodating the upper edge of the main housing space and along an axis connecting said upper edge and a closed end of the main cavity. Because of the great depth of said lateral slot, the electrical wires are bent little if at all as they emerge from the main housing space. As a preference, the two lateral slots of the one same lateral groove have the same depth. As an alternative, the lateral slot internal to the main housing space is deeper than the lateral slot running between the inside and the outside of the main housing.

As a preference, in the end-product (consisting of the protective housing accommodating the printed circuit connected to the electrical wires), at least one of the electrical wires is substantially straight, for example a central electrical wire of a stack of electrical wires. In any event, the electrical wires are bent to a lesser extent by comparison with the prior art. The mechanical stresses, notably on the electrical connections between the electrical wires and the printed circuit, are therefore correspondingly reduced.

In each lateral groove, the lateral slot running between the inside and the outside of the main housing space may extend to a depth of between 50% and 75% of the depth of the main cavity. Stated another way, the lateral slot is very extensive along an axis connecting the closed end of the main housing space and an upper edge of the main housing space. This extent is typically between 75% and 50% of the depth of the cavity. The depth of said lateral slot is notably dependent on the maximum number of electrical wires able to emerge from inside the main housing space and toward the outside thereof.

The retaining element may be a solid component made of plastic.

Each retaining element may notably comprise a component made of molded plastic, able to be held inside the corresponding lateral groove by clip-fastening.

In one advantageous embodiment, the retaining element is made from the same material as the main housing space.

As an alternative, the retaining element may be a metal blade of mainly U-shape. What is meant by a "mainly U-shape" is a shape having two substantially mutually parallel legs arranged facing one another and connected at one of their ends by a joining portion. As a preference, said blade is elastically deformable. Stated another way, it exhibits a spring effect such that the legs have a tendency to return to their rest position when subjected to mechanical stress.

Advantageously, each retaining element therefore consists of a blade, or strip, bent into a U-shape with two legs which are connected by a portion that is flat or rounded or of any other shape. Each leg has one end bent over toward that portion. The ends of the two legs are bent over in the same direction, or in opposite directions, and not necessarily with the same radius of curvature. In alternative forms, the strip is made of a non-metallic material, for example of a plastic.

The main housing space may have a single lateral groove. As a variant, the main housing space may have two lateral grooves situated one on each side of the main cavity. Stated another way, the main housing space may comprise a single groove according to the invention, or two grooves which, in use, are situated one on each side of the printed circuit.

As a preference but nonlimitingly, the protective housing according to the invention is configured to be installed on board an automotive vehicle, notably inside an exterior door-handle of the vehicle or inside a door lateral upright, or inside a bumper, or inside a tailgate or trunk lid, or inside a fuel filler flap or, respectively, an electric charging point flap, etc.

Thus, in the invention, a generic component (referred to as retaining element) holds the wires in position in the main housing space (preferably made of plastic) preferably irrespective of the number of wires. This generic component may be assembled in the main housing space using an automatic process. This component may be made of plastic or of metal. When it is made of plastic, the generic component may be held in the plastic housing by clip fastening. When it is made of plastic, the generic component may be injection-molded in the same mold as the main housing space, at no additional cost. When it is made of metal, the generic component may be assembled in the main housing space without increasing the exterior volume (no clip-fastening hook). When it is made of metal, the generic component is held in the plastic housing by deformation anchoring. The generic component is a component that can be used in all types of main housing space (preferably made of plastic) which are intended to allow electrical wires to emerge.

The invention also covers an assembly comprising a protective housing according to the invention, together with a printed circuit housed inside the main cavity, with electrical wires connected to the printed circuit and emerging out of the protective housing by passing through the two lateral slots of each lateral groove, said electrical wires being pressed against at least one closed end of said lateral slots, using the at least one retaining element. What is meant by "at least one closed end" is that the wires may be pressed against the closed end of just one of said lateral slots or against the two respective closed ends of said lateral slots.

As a preference, the printed circuit is configured to detect presence and/or authenticate a user in order to control access to an automotive vehicle and/or to illuminate a region external to said automotive vehicle and/or illuminate the ground.

The invention also covers said main housing space of a protective housing according to the invention.

The invention also covers the retaining element of a protective housing according to the invention.

DESCRIPTION OF THE FIGURES

Other features and advantages of the invention will become more apparent upon reading the following description. This description is purely illustrative and should be read with reference to the appended drawings, in which:

FIG. 2E schematically illustrates, in another perspective and cross-sectioned view, the detail of the housing of FIG. 2A with the retaining element inserted in the corresponding lateral groove, and with the printed circuit inserted into said housing;

FIG. 3A schematically illustrates, in a perspective view showing hidden detail, the detail of a protective housing according to a second embodiment of the invention and a printed circuit inserted into said housing;

DETAILED DESCRIPTION OF AT LEAST ONE EMBODIMENT

Figure 1A:
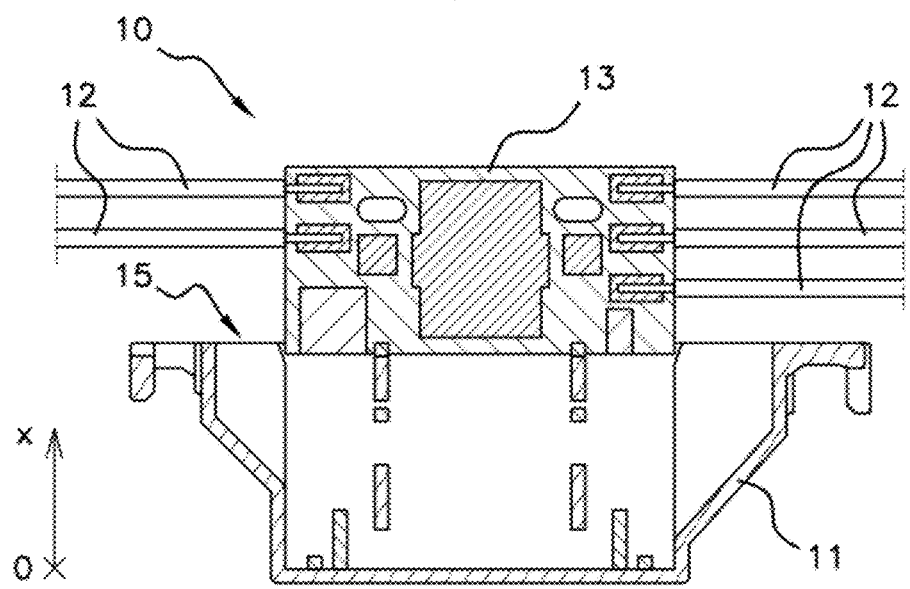
FIG. 1A schematically illustrates, in a view in section, a protective housing according to the prior art and a printed circuit ready to be inserted into said housing.
Figure 1B:
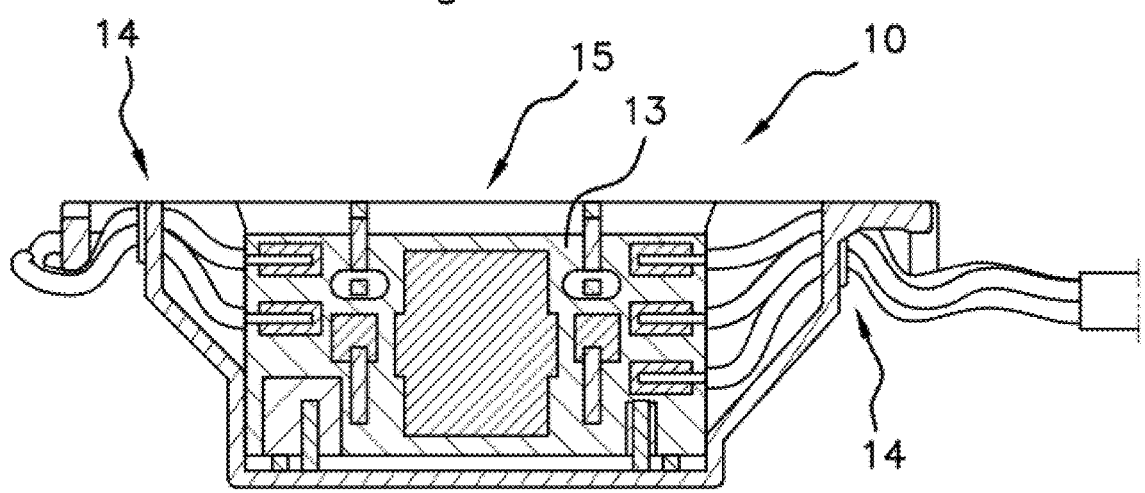
FIG. 1B schematically illustrates, in a view in section, the protective housing according to FIG. 1A, with the printed circuit inserted in said housing.

FIGS. 2A to 2E illustrate a first embodiment of a protective housing according to the invention. An orthonormal frame of reference (Oxyz) has been indicated in these figures.

The protective housing according to the invention is configured to receive a printed circuit 130 connected to a series of electrical wires 120. Said printed circuit 110 here is configured to control access to an automotive vehicle. Said protective housing is configured to be installed on board an automotive vehicle, for example but nonlimitingly, in an exterior door handle of said vehicle.

The protective housing comprises a main housing space 111 and at least two retaining elements 112, or plugs.

Here, the main housing space 111 is configured to receive the printed circuit 130 with the plane of the printed circuit 130 oriented parallel to the plane (Oxy). The axis (Oz) here corresponds to the axis of the thickness of the printed circuit 130, and therefore of the inside of the main housing space 111.

The main housing space 111 is configured to receive the printed circuit 130, inserted into a main cavity 113 formed inside the main housing space, via an upper opening. The upper opening has a shape that is elongate along the axis (Oy).

The main housing space 111 further comprises, on each side of said upper opening, or on just one side of said upper opening, a lateral groove 114 for the electrical wires 120 to pass out of the main housing space. The lateral groove 114 here extends along the axis (Ox), which is the axis along which the printed circuit 130 is translationally moved when it is inserted into the main housing space 111. The above-mentioned upper opening opens as a single entity onto the main cavity 113 and onto the at least one lateral groove 114.

The lateral groove 114 comprises two lateral slots 115A, 115B situated facing one another, one on the side closest to the inside of the main housing space 111, and the other on the opposite side along the axis (Oy). Each of the lateral slots 115A, 115B extends from an upper edge 116 of the main housing space 111, at the upper opening formed therein, and extends toward the closed end of the lateral groove, which is at the opposite end to said upper edge 116.

The two lateral slots 115A, 115B preferably have similar dimensions and are aligned together along an axis (Oy). In variants which have not been depicted, the slot 115B does not have the same dimensions as the slot 115A, with the slot 115B preferably being deeper than the slot 115A, and with the slot 115B preferably being wider than or the same width as the slot 115A. Said depths are measured along the axis (Ox) and from the upper edge 116 of the main housing space 111.

Here, the lateral slots 115A, 115B both extend to the same depth P along the axis (Ox) (see FIG. 2B), which depth typically represents between 75% and 50% of the depth of the main cavity 113. The depth of the lateral slots 115A, 115B is notably dependent on the maximum number of electrical wires liable to be connected to the printed circuit. The depth of the lateral slots 115A, 115B and the depth of the main cavity 113 are both measured from an upper edge 116 of the main housing space 111, at the upper opening formed in said main housing space.

In manufacture, the printed circuit 130 with the electrical wires 120 is inserted inside the main housing space 111. On at least one side of the main housing space 111, the electrical wires 120 emerge from this space by passing through the first lateral slot 115B and then through the inside of the lateral groove 114, and then through the second lateral slot 115A.

The electrical wires 120 are thus held in place in the two lateral slots 115A, 115B, stacked on top of one another along the axis (Ox), with adjacent electrical wires 120 in direct physical contact with one another.

The electrical wires are pushed as far as the closed end of the two lateral slots 115A, 115B. Because of the depth of said lateral slots 115A, 115B, the electrical wires are nevertheless bent very little if at all when in position in these slots. This then overcomes at least some of the disadvantages of the prior art.

In order to hold the electrical wires in place, and close the main housing space 111 to avoid any resin leaking out during the subsequent step of injecting the potting resin, each lateral groove 114 is then closed by a respective retaining element, here consisting of a respective plug 112.

The plug 112 is configured to push into the lateral groove 112, between an upper edge of the stack of electrical wires 120 and an upper edge of the lateral groove 114, at the end corresponding to the upper opening of the main housing space 111. The plug 112 is preferably made of plastic.

The plug 112 is configured to be held in the lateral groove 114 by clip fastening. For that purpose it comprises for example at least one lug configured to collaborate with complementing recesses and/or projections formed in the lateral groove.

Figure 2A:
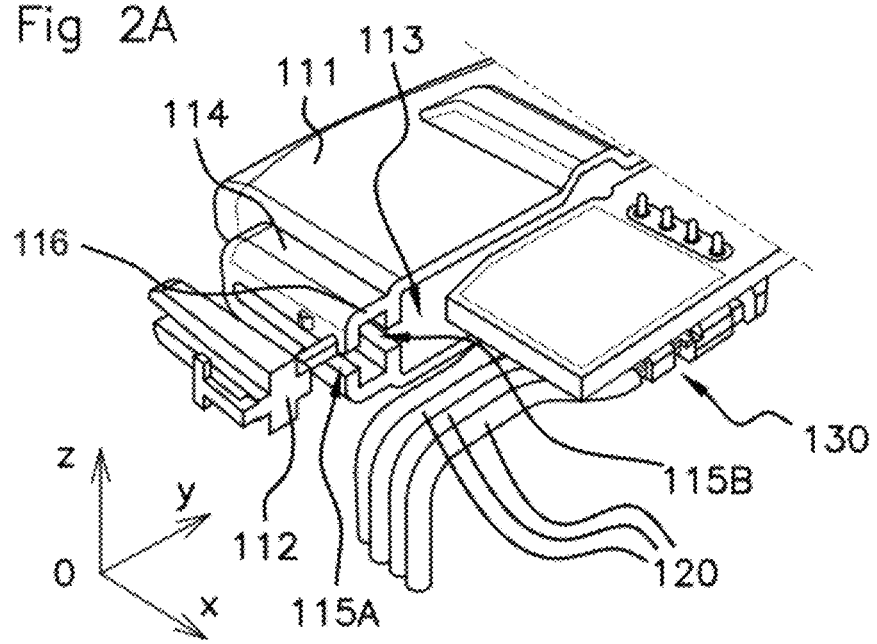
FIG. 2A schematically illustrates, in a perspective view, the detail of a protective housing according to a first embodiment of the invention and a printed circuit ready to be inserted into said housing.

Part of the main housing space 111 and part of the assembly made up of the printed circuit 130 with the electrical wires 120 is depicted, in an exploded and perspective view, in FIG. 2A. The plug 112 here is depicted beside the lateral groove 114 and here connected to the lateral groove 114 by a small frangible portion of material.

Figure 2B:
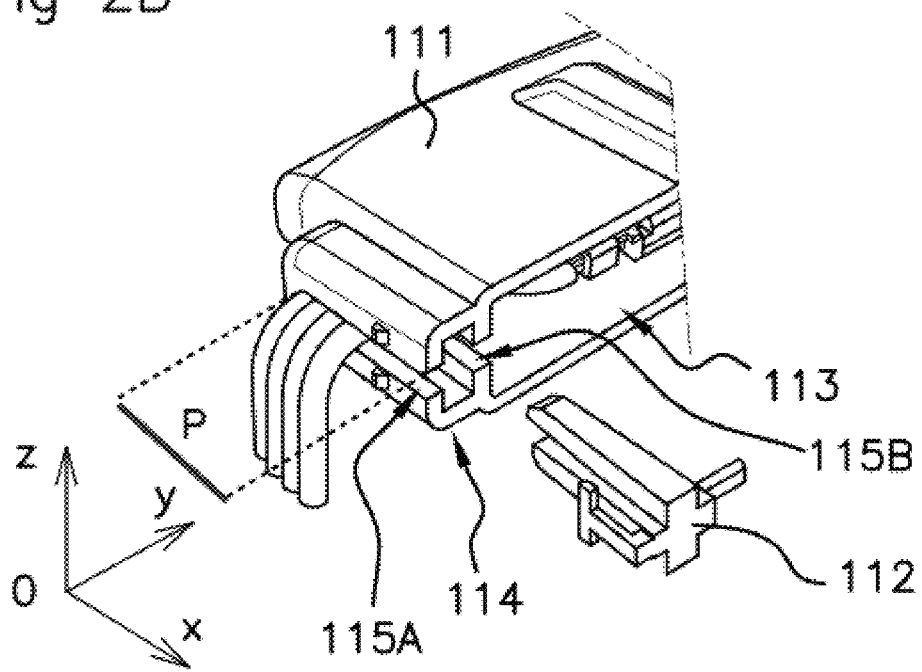
FIG. 2B schematically illustrates, in a perspective view, the detail of the housing of FIG. 2A with a retaining element ready to be inserted in the corresponding lateral groove.

FIG. 2B depicts the same elements, but this time with the printed circuit 130 and the electrical wires 120 situated inside the main housing space 111, and the plug 112 ready to effect a translational movement along the axis (Ox), inside the lateral groove 114.

Figure 2C:
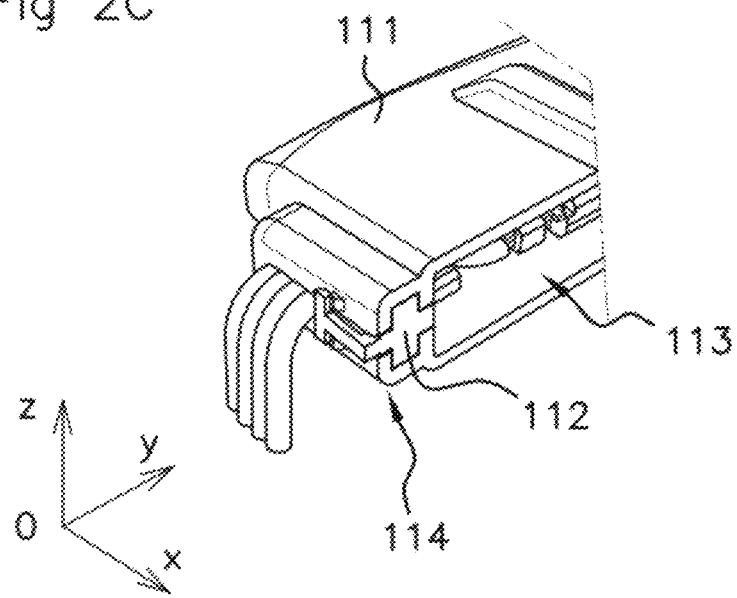
FIG. 2C schematically illustrates, in a perspective view, the detail of the housing of FIG. 2A with the retaining element inserted in the corresponding lateral groove.

FIG. 2C depicts the same elements, but this time with the plug 112 installed inside the lateral groove 114. The plug 112 serves not only to hold the electrical wires in place, but also to prevent any resin poured subsequently into the main housing space from escaping, by plugging an upper region of the lateral slots and by keeping the electrical wires closely packed against one another and against the closed end of the lateral slots.

Figure 2D:
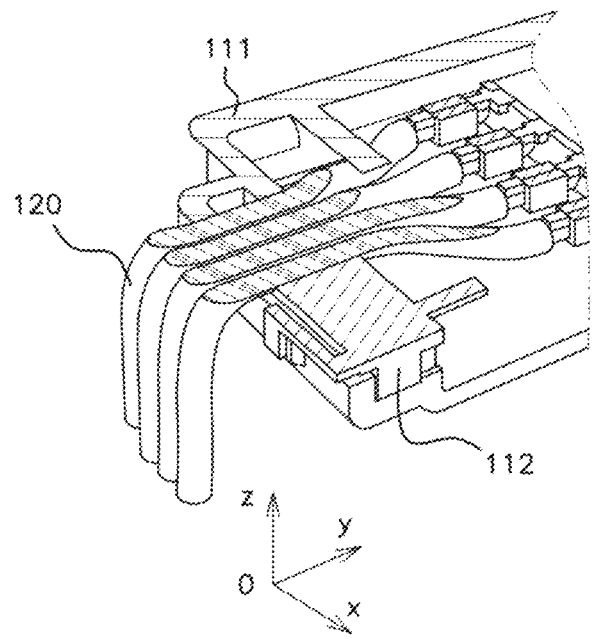
FIG. 2D schematically illustrates, in a perspective and cross-sectioned view, the detail of the housing of FIG. 2A with the retaining element inserted in the corresponding lateral groove, and with the printed circuit inserted into said housing.

FIG. 2D corresponds to a view of FIG. 2C in section on a plane (Oxy) passing through the two lateral slots 115A, 115B.

FIG. 2E corresponds to a view of FIG. 2C in section on a plane (Oxy) passing through the plug 112.

The invention covers the protective housing comprising the main housing space 111 and at least one plug 112. The invention also covers the plug alone, configured to be pushed into a lateral groove of such a main housing space 111, and the main housing space 111, notably with the at least one lateral groove equipped with two lateral slots.

The invention is not restricted to the specific dimensions and numbers of electrical wires depicted in the figures.

As a preference, the main housing is equipped with two lateral grooves, which in use are situated one on each side of the printed circuit, each one having two slots as described hereinabove with, in use, a respective plug in each of said lateral grooves. As a variant, all of the electrical wires terminate on the one same edge of the printed circuit board so that the main housing space is equipped with just one lateral groove as described hereinabove.

Figure 3B:
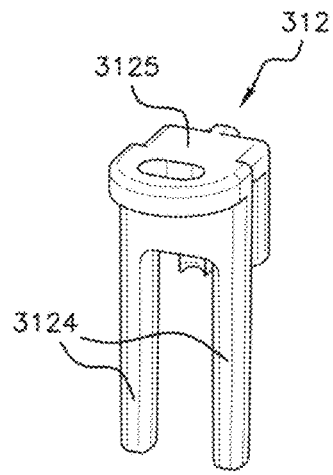
FIG. 3B schematically illustrates, in a perspective view, a retaining element of the housing of FIG. 3A.
Figure 3C:
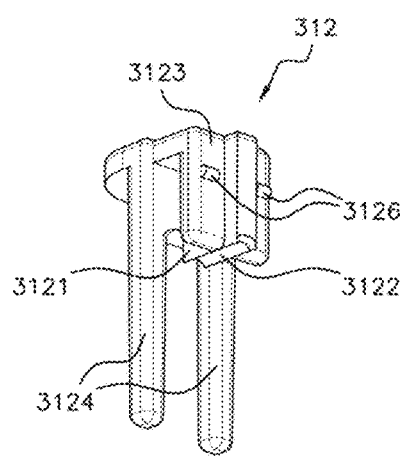
FIG. 3C schematically illustrates, in another perspective view, the retaining element of FIG. 3B.

Next, FIGS. 3A to 3C depict a variant of this embodiment which will be described only in terms of its differences relative to the embodiment of FIGS. 2A to 2D.

Part of the main housing space 311 and part of the assembly made up of the printed circuit 330 with the electrical wires 320 is depicted, in a perspective view, in FIG. 3A. The plug 312 is depicted here as having been installed in the lateral groove 314.

FIGS. 3B and 3C depict the plug 312 in two perspective views.

The plug 312 has:
a first solid wall 3121, intended to be inserted into the slot 315 between an upper edge of said slot and an upper edge of the stack of electrical wires,
a small lateral groove 3122, intended to match the shape of the uppermost electrical wire of said stack of electrical wires, and cut into said first solid wall 3121 at the end intended to come into contact with the stack of electrical wires,
a second solid wall 3123, orthogonal to the first solid wall 3121 and intended to fill the lateral groove 314, between the top of the stack of electrical wires and an upper edge of said lateral groove 314, at an upper edge of the main housing space 311 via which the printed circuit is pushed into the main housing space 311,
two legs 3124, which are intended to be pushed into the main housing space 311 and on the outside of the lateral groove 314, so as to perform a rough first guidance of the electrical wires,
an upper wall 3125, connecting the two legs 3124 and the second solid wall 3123, and intended to lie flush with the upper surface of the main housing space 311, at which the printed circuit is pushed into said main housing space 311, and
lugs 3126, formed in the second solid wall 3123, and configured to collaborate with the main housing space in order to clip-fasten the plug 312 in the lateral groove of said main housing space.

The two legs 3124 also, because of their large dimensions, make the plug 312 easier to grasp by hand.

The invention covers the protective housing comprising: the main housing space 311 suited to such a plug, and at least one plug 312. The invention also covers the plug 312 alone, as well as the main housing space 311 alone, notably with the at least one lateral groove equipped with two lateral slots.

The invention is not restricted to the specific dimensions and numbers of electrical wires depicted in the figures.

As a preference, the main housing is equipped with two lateral grooves, which in use are situated one on each side of the printed circuit, each one having two slots as described hereinabove with, in use, a respective plug in each of said lateral grooves. As a variant, all of the electrical wires terminate on the one same edge of the printed circuit board so that the main housing space is equipped with just one lateral groove as described hereinabove.

FIGS. 4A to 4F illustrate a particularly advantageous third embodiment of the invention.

Figure 4A:
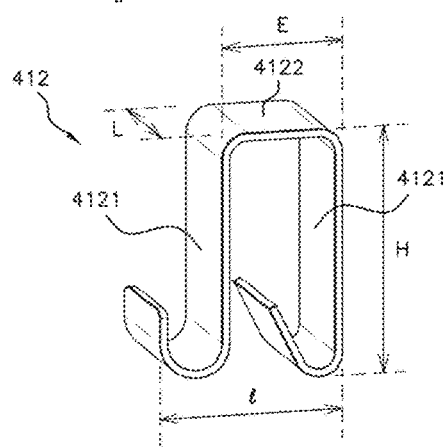
FIG. 4A schematically illustrates, in a perspective view, a retaining element of a protective housing according to a third embodiment of the invention.

In this embodiment, the retaining element is formed by a clip 412, as depicted in perspective in FIG. 4A.

The clip 412 consists of a fine metal blade of constant width L, of a thickness of between 0.1 and 0.3 mm, for example 0.2 mm, bent to form two legs 4121 connected by a section 4122. In this instance, the section 4122 is flat. In variants which have not been illustrated, it may be curved or have any other shape whatsoever.

Each of the two legs 4121 comprises a planar portion and a curved portion situated at the opposite end from the section 4122.

The two legs 4121 are both bent up on the same side, but not necessarily both bent with the same radius of curvature.

Between the section 4122 and each of the legs 4121, the clip 412 is curved, with a radius of curvature that is smaller than each respective radius of curvature of the legs 4121.

Here, the height H of the clip is between 5 mm and 10 mm, for example 7.2 mm.

The spacing E between the two legs 4121 is between 3 mm and 5 mm, for example 3.6 mm.

The width L of the clip is between 3 mm and 5 mm, for example 4 mm (dimension along an axis orthogonal to the plane of the two planar portions of the legs 4121). Thus, the width L of the clip is advantageously greater than the spacing E between the two legs 4121.

Finally, the length I of the clip is between 7 mm and 4 mm, for example 5.4 mm. This refers to the maximum extent of the clip along an axis orthogonal to the plane of the two planar portions of the legs 4121.

Figure 4B:
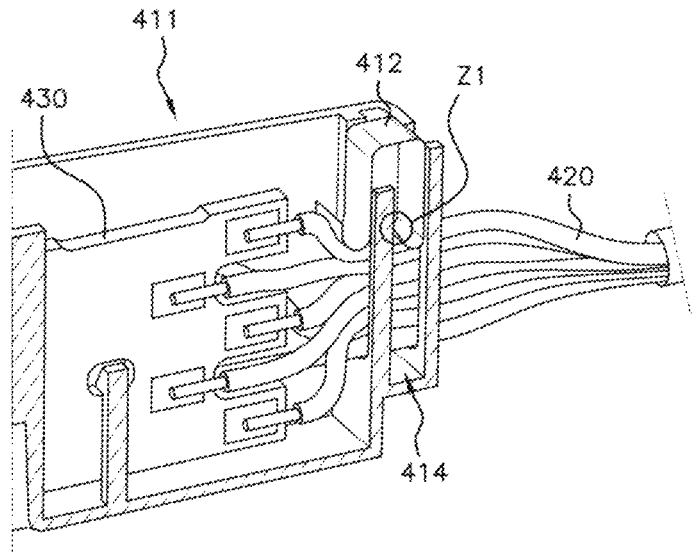
FIG. 4B schematically illustrates, in a perspective and cross-sectioned view, the detail of the protective housing according to the third embodiment of the invention and a printed circuit inserted into said housing.

The main housing space 411 is depicted in part, viewed in section and in perspective, in FIG. 4B. FIG. 4B shows the printed circuit 430 housed in the main housing space 411, the electrical wires 420 and the clip 412.

The main housing space 411 once again comprises a lateral groove 414 equipped with two lateral slots as described hereinabove.

Here, rather than closing the lateral groove 414 using a plug, a clip 412 is used.

One of the legs 4121 of the clip is pushed into the lateral groove 412, forcibly entering this groove. The planar portion of said bent-over leg here extends against a planar wall inside the lateral groove 414, closing a lateral slot above the stack of electrical wires 420. The bent-over portion of said leg 4121 comes to press against the stack of electrical wires 420, at the curved portion of said bent-over portion. At the end of this bent-over portion, the leg 4121 grips against an interior wall of the lateral groove 414 (see contact zone Z1). The leg 4121 is thus held in place by being anchored inside the lateral groove 414 either through deformation or through the effect of friction.

Thus, the clip 412 presses the stack of electrical wires toward the closed end of the lateral groove 412, to form a compact assembly impervious to a resin in liquid form. Furthermore, together with the collection of electrical wires, it contributes to closing a passage leading to the outside of the main housing space, so as to prevent any resin from escaping when this resin is poured into the main housing space.

The other of the legs 4121 of the clip here extends inside the main housing space 411, with its bent-over portion pressing against an uppermost electrical wire. The planar portion of said bent-over leg here extends against a planar wall inside the main housing space 411, closing the other lateral slot above the stack of electrical wires 420.

Figure 4C:
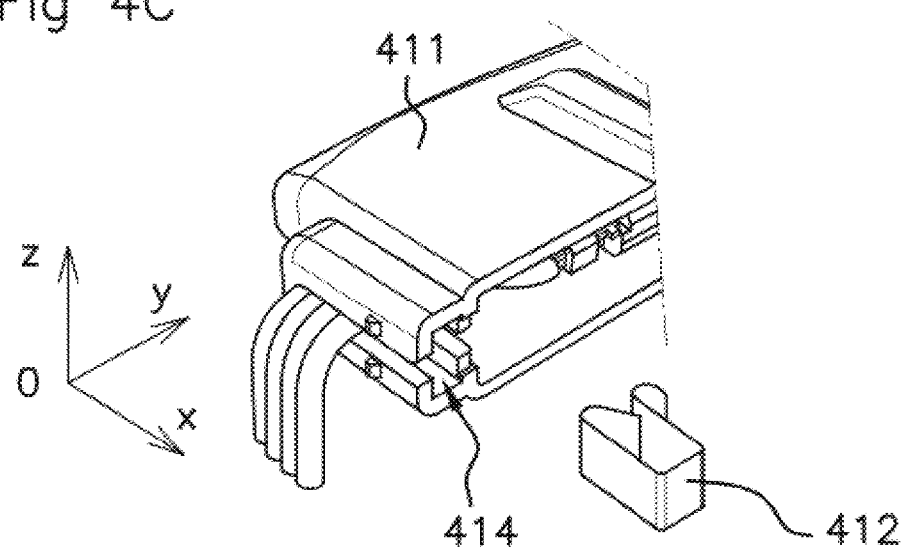
FIG. 4C schematically illustrates, in a perspective view, the detail of the protective housing of FIG. 4B with the retaining element ready to be inserted in the corresponding lateral groove.

FIG. 4C shows, viewed in perspective, the main housing space 411 housing the printed circuit with the electrical wires, as well as the clip 412 ready to be pushed into the housing space 411 in order to close the lateral groove 414 and hold the electrical wires in place.

Figure 4D:
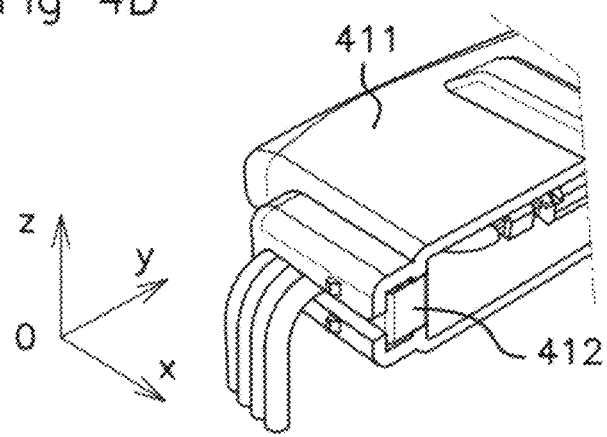
FIG. 4D schematically illustrates, in a perspective view, the detail of the protective housing of FIG. 4B with the retaining element inserted in the corresponding lateral groove.

FIG. 4D shows the same perspective view, but this time with the clip 412 pushed into the housing space 411.

Figure 4E:
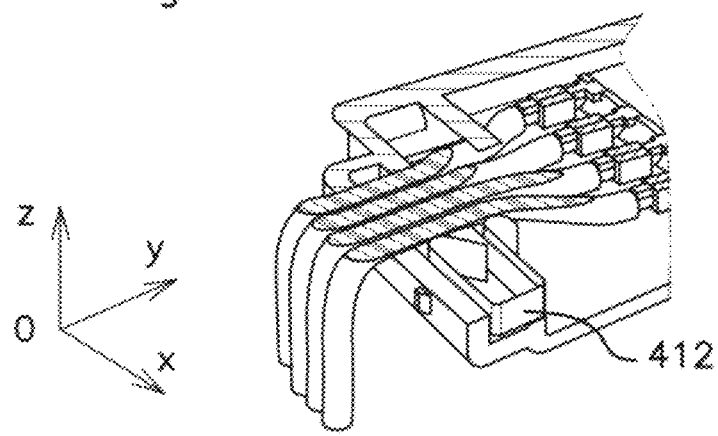
FIG. 4E schematically illustrates, in a perspective and cross-sectioned view, the detail of the protective housing of FIG. 4B with the retaining element inserted in the corresponding lateral groove.

FIG. 4E corresponds to a view of FIG. 4D in section on a plane (Oxy) passing through the plug 412.

Figure 4F:
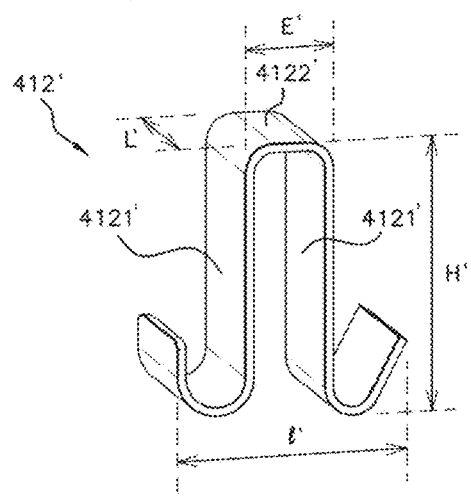
FIG. 4F schematically illustrates, in a perspective view, a variant of the retaining element of FIG. 4A.

FIG. 4F illustrates a variant 412' of the clip of FIG. 4A, which differs from the clip of FIG. 4A only in that the two legs 4121' are bent over in two opposite directions. In FIG. 4F, the clip 412' has a plane of symmetry passing between the two legs 4121'. As a variant, the two bent-over portions do not both have the same radius of curvature. The references 4122', E', I', L', H' correspond respectively to the references 4122, E, I, L, H. As a preference, L'=L, H'=H. Here, E'<E.

The invention covers the protective housing comprising the main housing space 411 and at least one clip 412. The invention also covers the clip alone, configured to be pushed into a lateral groove of such a main housing space 411, and the main housing space 411, notably with the at least one lateral groove equipped with two lateral slots.

The invention is not restricted to the specific dimensions and numbers of electrical wires depicted in the figures.

In a variant which has not been depicted, one of the legs of the clip is pushed into the lateral groove, as depicted in the figures, and the other of the legs of the clip extends outside the main housing space 411.

As a preference, the main housing is equipped with two lateral grooves, which in use are situated one on each side of the printed circuit, each one having two slots as described hereinabove with, in use, a respective clip in each of said lateral grooves. As a variant, all of the electrical wires terminate on the one same edge of the printed circuit board so that the main housing space is equipped with just one lateral groove as described hereinabove.

The clip may be made of a magnetic or non-magnetic metal, for example stainless steel. When the clip is made of metal it can be handled by magnetic gripping, potentially making assembly operations easier.

As a preference, the clip is of a standard size. The assembly consisting of clip and main housing space is then adapted to suit a given number of electrical wires by adapting the depth of the lateral groove and of the lateral slots in the main housing space.

In this embodiment, the clip may be pushed into the lateral groove down to a desired depth so as to keep the electrical wires of the stack of electrical wires closely packed together. There is a great deal of flexibility regarding the depths to which the clip can be pushed into the lateral groove, thereby making it possible to compensate for variations in the diameter of the electrical wires, which variations are connected with the tolerances in the manufacture thereof, so as to avoid subsequent leaks of potting resin.

The advantages of the invention are numerous:
It reduces the mechanical tension in the connections between the wires and the printed circuit
It reduces mechanical tensions in the wires caused by excessively small bend radii,
It prevents the printed circuit from popping out of the housing space (plastic housing).
It avoids a manual operation of routing the wires under a hook of the plastic housing.
It reduces the length of the plastic housing by eliminating the wire retaining hook.
It uses one single same component for holding the wires in place, whatever the number of wires.
The retaining piece that holds the wires in place can be fitted using an automatic process.

The invention also covers a manufacturing method wherein:

the printed circuit with its electrical wires is inserted into the main housing space, with the electrical wires emerging from the main housing by passing through at least one lateral slot open into at least one lateral groove formed in the main housing; and the at least one lateral groove is closed by a retaining element (plug or clip) configured to hold the electrical wires in the lateral groove in a compact stack.

The method preferably then comprises a step of adding potting resin inside the main housing space.

The invention may be implemented in numerous fields other than that of presence sensors for accessing an automotive vehicle.

The figures depict various embodiments of a protective housing according to the invention, illustrating just half of the housing, situated on just one side of a plane (Oxz) that passes through the middle of the main cavity. The housing is substantially symmetrical about this plane. This may be perfect symmetry or approximate symmetry, there being, for example, a lateral groove on just one side of this plane.

The invention claimed is:

1. A protective housing intended to be fitted on board an automotive vehicle, comprising a main housing space which is equipped with a main cavity to receive a printed circuit and which comprises an upper opening for the insertion of the printed circuit into the main cavity, wherein:
the main housing space comprises at least one lateral groove, which extends along a lateral edge of the main housing space and which comprises two lateral slots each extending from an upper edge of the main housing space, at the same end as the upper opening, and together forming a passage between the inside and the outside of the main housing space;
for each lateral groove, the protective housing comprises a respective retaining element, intended to be inserted at least partially into the corresponding lateral groove, each retaining element being configured to locally close the passage between the inside and the outside of the main housing space and, in use, to come to bear against a bundle of electrical wires emerging from the main cavity via the two lateral slots; and
at each lateral groove, the two lateral slots each have a width substantially equal to the diameter of the electrical wires of said bundle of electrical wires, so that, in use, said electrical wires are held in the position stacked on top of one another.

2. The protective housing as claimed in claim 1, wherein in each lateral groove, the lateral slot running between the inside and the outside of the main housing space extends to a depth greater than or equal to half the depth of the main cavity, said depths being measured from a plane accommodating the upper edge of the main housing space and along an axis connecting said upper edge and a closed end of the main cavity.

3. The protective housing as claimed in claim 2, wherein, in each lateral groove, the lateral slot running between the inside and the outside of the main housing space extends to a depth of between 50% and 75% of the depth of the main cavity.

4. The protective housing as claimed in claim 1, wherein the retaining element is a solid component made of plastic.

5. The protective housing as claimed in claim 1, wherein the retaining element is made of the same material as the main housing space.

6. The protective housing as claimed in claim 1, wherein the retaining element is a metal blade of mainly U-shape.

7. The protective housing as claimed in claim 1, wherein the main housing space has a single lateral groove.

8. The protective housing as claimed in claim 1, wherein the main housing space has two lateral grooves, situated one on each side of the main cavity.

9. An assembly comprising a protective housing as claimed in claim 1, together with a printed circuit housed inside the main cavity, with electrical wires connected to the printed circuit and emerging out of the protective housing by passing through the two lateral slots of each lateral groove, said electrical wires being stacked on top of one another at said lateral slots, and pressed together against at least one closed end of said lateral slots, using the at least one retaining element.

10. The assembly as claimed in claim 9, wherein the printed circuit is configured to detect presence and/or authenticate a user in order to control access to an automotive vehicle and/or to illuminate a region external to said automotive vehicle and/or illuminate the ground.

11. A main housing space of a protective housing as claimed in claim 1.

12. A retaining element of a protective housing as claimed in claim 1.

13. The protective housing as claimed in claim 2, wherein the retaining element is a solid component made of plastic.

14. The protective housing as claimed in claim 13, wherein the retaining element is made of the same material as the main housing space.

15. The protective housing as claimed in any claim 14, wherein the main housing space has a single lateral groove.

16. An assembly comprising a protective housing as claimed in claim 15, together with a printed circuit housed inside the main cavity, with electrical wires connected to the printed circuit and emerging out of the protective housing by passing through the two lateral slots of each lateral groove, said electrical wires being stacked on top of one another at said lateral slots, and pressed together against at least one closed end of said lateral slots, using the at least one retaining element.

17. The assembly as claimed in claim 16, wherein the printed circuit is configured to detect presence and/or authenticate a user in order to control access to an automotive vehicle and/or to illuminate a region external to said automotive vehicle and/or illuminate the ground.

18. A main housing space of a protective housing as claimed in claim 14.

19. A main housing space of a protective housing as claimed in claim 15.

20. A retaining element of a protective housing as claimed in claim 15.

* * * * *